US012630915B2

(12) United States Patent　　(10) Patent No.: US 12,630,915 B2
　Kim et al.　　　　　　　　　　　(45) Date of Patent: May 19, 2026

(54) DEPOSITION MASK, METHOD OF MANUFACTURING DISPLAY DEVICE USING THE DEPOSITION MASK, AND DISPLAY DEVICE

(71) Applicant: Samsung Display Co., Ltd., Yongin-si (KR)

(72) Inventors: Jeongkuk Kim, Yongin-si (KR); Youngmin Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 88 days.

(21) Appl. No.: 18/123,394

(22) Filed: Mar. 20, 2023

(65) Prior Publication Data

US 2023/0232667 A1　　Jul. 20, 2023

Related U.S. Application Data

(62) Division of application No. 16/930,914, filed on Jul. 16, 2020, now Pat. No. 11,621,310.

(30) Foreign Application Priority Data

Nov. 26, 2019　(KR) ........................ 10-2019-0153544

(51) Int. Cl.
　　*C23C 14/04*　　(2006.01)
　　*C23C 14/12*　　(2006.01)
　　　　　　(Continued)
(52) U.S. Cl.
　　CPC ............ *C23C 14/12* (2013.01); *C23C 14/042* (2013.01); *C23C 14/24* (2013.01); *H10K 59/122* (2023.02);
　　　　　　(Continued)

(58) Field of Classification Search
　　CPC ..... H10K 59/122; H10K 59/124; H10K 59/60
　　　　　　(Continued)

(56) References Cited

U.S. PATENT DOCUMENTS 5,412,285 A * 5/1995 Komatsu ................ B82Y 10/00
　　　　　　　　　　　　　　　　313/309
9,484,391 B2 11/2016 Kwon
　　　　　　(Continued)

FOREIGN PATENT DOCUMENTS

CN　　　1630438　　　6/2005
CN　　109957754　　　7/2019
　　　　　　(Continued)

OTHER PUBLICATIONS

English Machine Translation of JP 2006/249489. (Year: 2006).*

(Continued)

*Primary Examiner* — Dzung Tran
(74) *Attorney, Agent, or Firm* — Lerner David LLP

(57) ABSTRACT

Provided are a deposition mask, a method of manufacturing a display device using the deposition mask, and a display device. The deposition mask includes a main frame defining a first opening; ribs extending away from a side of the main frame, the ribs being apart from each other and defining second openings; and bridges connecting the ribs to one another across the second openings, wherein the bridges and the ribs form the same top surface, and a thickness of each of the bridges is less than a thickness of each of the ribs.

12 Claims, 10 Drawing Sheets

(51) Int. Cl.
| | | |
|---|---|---|
| *C23C 14/24* | (2006.01) |
| *H10K 59/122* | (2023.01) |
| *H10K 59/124* | (2023.01) |
| *H10K 59/60* | (2023.01) |
| *H10K 59/80* | (2023.01) |
| *H10K 71/16* | (2023.01) |
| *H10K 71/60* | (2023.01) |

(52) U.S. Cl.
CPC ........... *H10K 59/124* (2023.02); *H10K 59/60* (2023.02); *H10K 59/80515* (2023.02); *H10K 59/80521* (2023.02); *H10K 71/166* (2023.02); *H10K 71/60* (2023.02)

(58) Field of Classification Search
USPC .......................................................... 257/40
See application file for complete search history.

(56) References Cited

U.S. PATENT DOCUMENTS

| | | | |
|---|---|---|---|
| 10,151,041 B2 | 12/2018 | Han | |
| 10,217,803 B2 | 2/2019 | Ryu | |
| 10,374,157 B2 | 8/2019 | Kim et al. | |
| 11,355,575 B2 | 6/2022 | Cui et al. | |
| 2001/0007406 A1 | 7/2001 | Kim | |
| 2002/0059903 A1 | 5/2002 | Hasegawa et al. | |
| 2005/0136668 A1 | 6/2005 | Yotsuya | |
| 2005/0275038 A1 | 12/2005 | Shih et al. | |
| 2007/0031742 A1 | 2/2007 | Hamawaki et al. | |
| 2011/0041758 A1 | 2/2011 | An | |
| 2012/0328851 A1 | 12/2012 | Kang | |
| 2013/0337588 A1 | 12/2013 | Lee et al. | |
| 2015/0165464 A1* | 6/2015 | Baek ..................... B05C 21/005 | |
| | | | 118/504 |
| 2017/0012087 A1 | 1/2017 | Seo et al. | |
| 2017/0271416 A1 | 9/2017 | Yu | |
| 2018/0089485 A1 | 3/2018 | Bok | |
| 2018/0151803 A1 | 5/2018 | Kim et al. | |
| 2018/0197897 A1 | 7/2018 | Xin et al. | |
| 2018/0198067 A1* | 7/2018 | Kim ...................... C23C 14/042 | |
| 2018/0277799 A1* | 9/2018 | Ikenaga ................. H10K 71/00 | |
| 2020/0135837 A1* | 4/2020 | Cui ...................... H10K 71/166 | |
| 2020/0235187 A1 | 7/2020 | Bae et al. | |
| 2020/0258947 A1 | 8/2020 | Chung | |
| 2021/0233986 A1 | 7/2021 | Hsieh | |

FOREIGN PATENT DOCUMENTS

| | | |
|---|---|---|
| CN | 110265461 | 9/2019 |
| CN | 110318019 | 10/2019 |
| JP | 2001-254169 | 9/2001 |
| JP | 2005-182005 | 7/2005 |
| JP | 2006-249489 | 9/2006 |
| JP | 2009-244576 | 10/2009 |
| JP | 2010-230797 | 10/2010 |
| JP | 2014-194062 | 10/2014 |
| JP | 2016-167378 | 9/2016 |
| JP | 2018-83985 | 5/2018 |
| KR | 10-2008-0062386 | 7/2008 |
| KR | 10-0982021 | 9/2010 |
| KR | 10-1192003 | 10/2012 |
| KR | 10-2013-0028165 | 3/2013 |
| KR | 10-2014-0127690 | 11/2014 |
| KR | 10-2015-0106504 | 9/2015 |
| KR | 10-2016-0106639 | 9/2016 |
| KR | 10-2016-0117798 | 10/2016 |
| KR | 10-2017-0107620 | 9/2017 |
| KR | 10-2018-0059606 | 6/2018 |

OTHER PUBLICATIONS

Chinese Office Action for Chinese Patent Application No. 202011102873.5, dated May 28, 2024.
Notice of Allowance for Korean Patent Application or Patent No. 10-2019-0153544, dated Oct. 27, 2024.
Chinese Office Action dated Mar. 10, 2025, in Chinese Patent Application No. 202011102873.5.

* cited by examiner

DEPOSITION MASK, METHOD OF MANUFACTURING DISPLAY DEVICE USING THE DEPOSITION MASK, AND DISPLAY DEVICE

CROSS-REFERENCE TO RELATED APPLICATION(S)

This is a divisional application based on U.S. patent application Ser. No. 16/930,914, filed on Jul. 16, 2020 (now pending), the entire contents of which are incorporated herein by reference. U.S. patent application Ser. No. 16/930,914 claims priority to and benefits of Korean Patent Application No. 10-2019-0153544 under 35 U.S.C. § 119, filed on Nov. 26, 2019 in the Korean Intellectual Property Office, the entire contents of which are incorporated herein by reference for all purposes.

BACKGROUND

1. Technical Field

One or more embodiments relate to a deposition mask, a method of manufacturing a display device using the deposition mask, and a display device.

2. Description of the Related Art

Recently, use of display devices has become diversified. As display devices have become thinner and lighter, their range of use has gradually been extended.

As display devices may be used in various ways, display devices have been designed to have various shapes. Also, functions that may be combined or associated with display devices continue to increase.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a deposition mask, a method of manufacturing a display device using the deposition mask, and a display device.

Additional aspects will be set forth in part in the description which follows and, in part, will be apparent from the description, or may be learned by practice of the presented embodiments of the disclosure.

According to one or more embodiments, a deposition mask may include a main frame defining a first opening, ribs extending away from a side of the main frame, the ribs being apart from each other and defining second openings, and bridges connecting the ribs to one another across the second openings, wherein the bridges and the ribs may form a same top surface, and a thickness of each of the bridges may be less than a thickness of each of the ribs.

A cross-section of each bridge may have an inverted triangle shape, the cross-section being perpendicular to a longwise direction of each bridge.

A width of each bridge in a direction perpendicular to a lengthwise direction of each bridge may be less than a thickness of each bridge, and a difference between the thickness of each rib and the thickness of each bridge may be at least about 0.5 times the width of each bridge.

A region of the main frame that neighbors the second openings may have a same shape of the bridges.

According to one or more embodiments, a display device may include a substrate, a first display area including first pixels disposed over the substrate, and a second display area including second pixels disposed over the substrate and having a resolution different from a resolution of the first display area, wherein the first pixels and the second pixels may include a common electrode, the common electrode may include a main common electrode corresponding to the first display area, and extension portions extending from the main common electrode to the second display area and being apart from each other, and each of the extension portions includes a first region between the second pixels, the first region being thinner than the main common electrode.

The common electrode may further include second regions thinner than the main common electrode in connection portions of the main common electrode and the extension portions.

The first region may cross a corresponding extension portion among the extension portions.

A transmission area may be defined between the extension portions in the second display area, and the common electrode may not be disposed in the transmission area.

A resolution of the second display area may be less than a resolution of the first display area.

The display device may further include a component for detecting an external signal, the component being disposed at a position overlapping the second display area.

Each of the first pixels and the second pixels may include a thin film transistor, and an organic light-emitting diode electrically connected to the thin film transistor, and a blocking layer may be further disposed between the thin film transistor and the substrate in the second display area.

A first buffer layer and a second buffer layer may be further disposed on the substrate, and the blocking layer may be disposed between the first buffer layer and the second buffer layer.

An active layer of the thin film transistor may include a silicon material, the first buffer layer may include silicon nitride, and the second buffer layer may include silicon oxide.

The display device may further include a planarization layer between the thin film transistor and the organic light-emitting diode, and a pixel-defining layer disposed on the planarization layer and covering edge portions of a pixel electrode of the organic light-emitting diode to define an emission region, wherein a portion of the planarization layer and a portion of the pixel-defining layer corresponding to a position overlapping the transmission area may be removed.

A number of second pixels disposed in the second display area per a unit area may be less than a number of first pixels disposed in the first display area per the unit area.

According to one or more embodiments, a method of manufacturing a display device may include attaching a substrate to a deposition mask, and forming a common electrode over the substrate through the deposition mask, wherein the deposition mask may include a main frame defining a first opening, ribs protruding away from a side of the main frame, the ribs being apart from each other and defining second openings, and bridges fixing the ribs to one another by connecting the ribs across the second openings, each of the bridges having a thickness less than a thickness of the each of the ribs, the common electrode may include a main common electrode being deposited through the first opening, and extension portions being deposited through the second openings between the ribs, and the extension portions may include a first region thinner than the main common electrode in a position where the bridges may be disposed.

A region of the main frame that neighbors the second openings may have a same shape of the bridges, second regions may be formed in connection portions of the main common electrode and the extension portions, and the second regions and the first region may have a same shape.

The ribs and the bridges may form a same top surface.

The common electrode may not be formed in a transmission area between the extension portions.

A component for sensing an external signal may be further disposed at a position overlapping at least the transmission area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
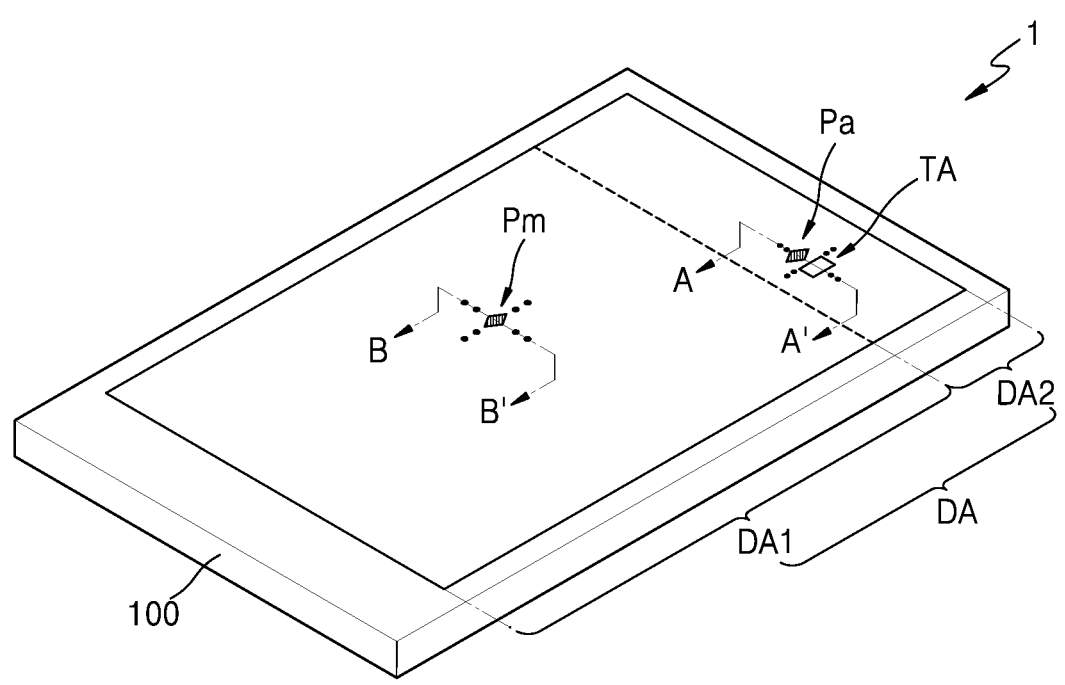
FIG. 1 is a schematic perspective view of an example of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

Sizes of elements in the drawings may be exaggerated or reduced for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

The term overlap may include layer, stack, face or facing, extending over, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic perspective view of an example of a display device 1 according to an embodiment.

Referring to FIG. 1, a display area DA of the display device 1 may include a first display area DA1 and a second display area DA2. The first display area DA1 may be a main display area displaying a main image by using light emitted from first pixels Pm.

The second display area DA2 may be an area in which an input/output component 300 such as a sensor that may use a light signal or a sound signal may be disposed (e.g., arranged) below a substrate 100. The input/output component 300 may emit, receive, or emit and receive, for example, light and/or sound. A transmission area TA may be provided in the second display area DA2 such that the input/output component 300 may receive an external light signal and/or sound signal, and such signals may be output to the outside of the display device 1 from the input/output component. Since second pixels Pa may be disposed in the second display area DA2, the second display area DA2 may display an image by using light emitted from the second pixels Pa. However, since the transmission area TA may be disposed in the second display area DA2, the resolution of an image provided by the second display area DA2 may be less than the resolution of an image provided by the first display area DA1. For example, the number of second pixels Pa disposed in the second display area DA2 per same unit area may be less than the number of first pixels Pm disposed in the first display area DA1 per same unit area.

Hereinafter, though the display device 1 according to an embodiment may be described as an organic light-emitting display device as an example, a display device 1, a deposition mask, and a method of manufacturing a display device according to embodiments may be or may be applied with various types of display devices such as inorganic light-emitting displays and quantum dot light-emitting displays. Similarly, a display device, a deposition mask, and a method of manufacturing a display device may be applied as various technologies, including as a phone, a head up display, a television, an artificial intelligence device, etc.

Figure 2:
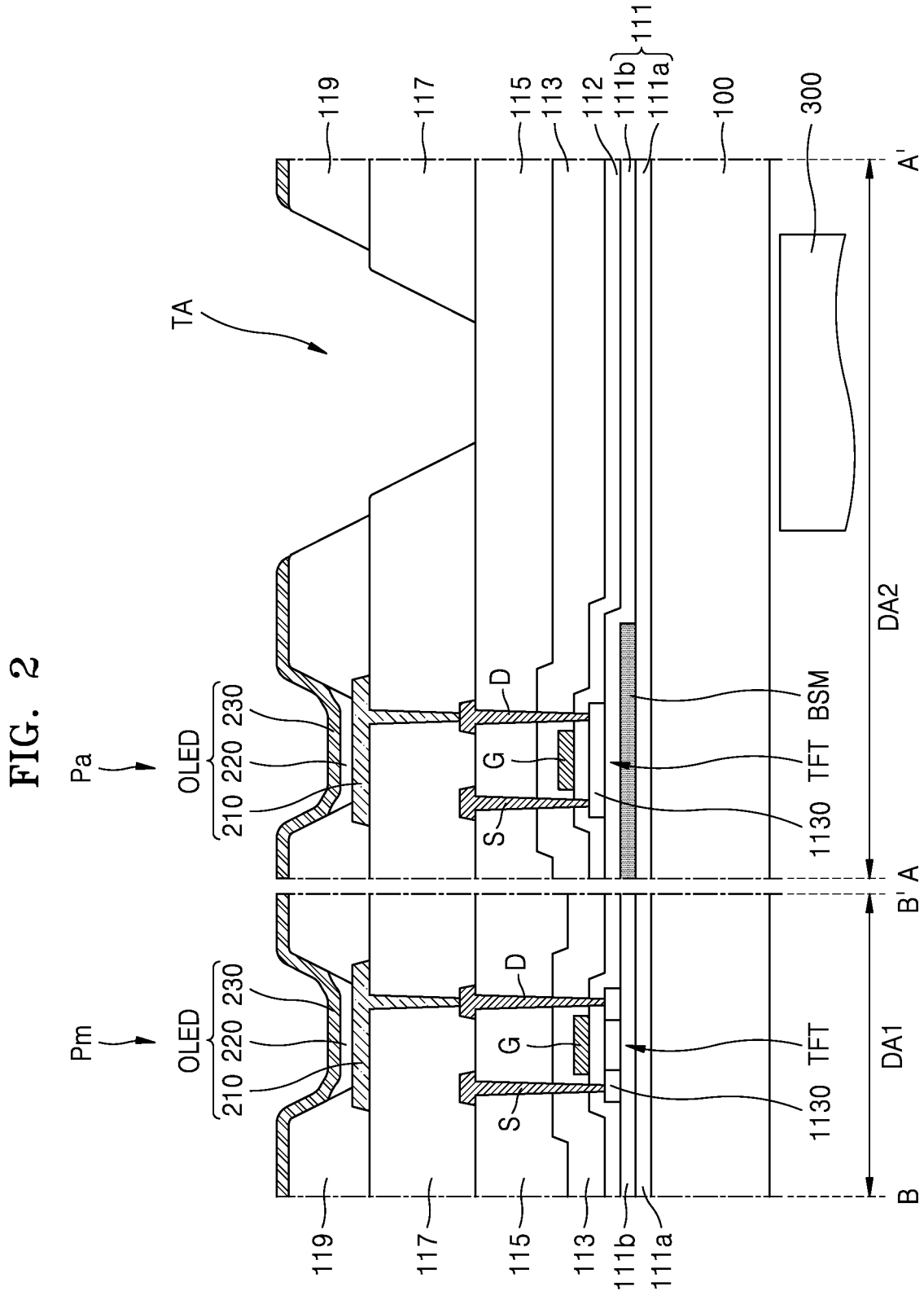
FIG. 2 is a schematic cross-sectional view of an example of cross-sections of the display device taken along lines A-A' and B-B' of FIG. 1.

FIG. 2 is a schematic cross-sectional view of an example of cross-sections of the display device taken along lines A-A' and B-B' of FIG. 1.

As shown in FIG. 2, the first pixel Pm and the second pixel Pa may include an organic light-emitting diode OLED having a similar structure and a thin film transistor TFT having a similar structure. A difference between the first pixel Pm and the second pixel Pa may be the number of pixels per unit area in the first display area DA1 and the second display area DA2.

The display device 1 may include the substrate 100 and the input/output component 300. The substrate 100 may include the first display area DA1 and the second display area DA2, and the input/output component 300 may be disposed at a position overlapping the second display area DA2.

The input/output component 300 may include an electronic element that may use light or sound. For example, the input/output component 300 may be a sensor such as an infrared sensor that emits and/or receives light, a sensor that outputs and senses light or sound to measure a distance or recognize a fingerprint, a small lamp that outputs light, a speaker that outputs sound, and/or an image-pickup device. An electronic element that uses light may use light in various wavelength bands such as visible light, infrared light, and ultraviolet light. The number of input/output components 300 disposed in the second display area DA2 may be provided in plural. For example, a light-emitting element and a light-receiving element as the input/output component 300 may be provided together in a second display area DA2. As another example, a light-emitting element and a light-receiving element may be simultaneously provided in a single input/output component 300.

The substrate 100 may include glass, a polymer resin, or a combination thereof. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 including the polymer resin may be flexible, rollable, or bendable. The substrate 100 may have a multi-layered structure including a layer including the polymer resin, and an inorganic layer (not shown).

A buffer layer 111 may be disposed on the substrate 100. The buffer layer 111 may reduce or block the penetration of foreign substances, moisture, or external air from below the substrate 100 and provide a flat surface on the substrate 100.

The buffer layer 111 may include an inorganic material such as an oxide or a nitride, an organic material, or an organic/inorganic composite material, and may include a single layer or a multi-layer including an inorganic material and an organic material. For example, the buffer layer 111 may have a structure in which a first buffer layer 111a and a second buffer layer 111b may be stacked. The first buffer layer 111a and the second buffer layer 111b may include different materials. For example, the first buffer layer 111a may include silicon nitride, for example, $SiN_x$. The second buffer layer 111b may include silicon oxide, for example, $SiO_x$.

In the case where the first buffer layer 111a includes silicon nitride, hydrogen may be included in forming the silicon nitride. Through this technique, the carrier mobility of an active layer 1130 formed on the buffer layer 111 may be improved and the electric characteristic of a thin film transistor TFT may be improved. The active layer 1130 may include a silicon material. An interface bonding characteristic between the active layer 1130 including silicon and the second buffer layer 111b including silicon oxide may be improved and thus the electric characteristic of the thin film transistor TFT may be improved.

The thin film transistor TFT may be disposed on the buffer layer 111, the thin film transistor TFT including the active layer 1130, a gate electrode G, a source electrode S, and a drain electrode D. Hereinafter, though a top gate-type thin film transistor TFT in which the gate electrode G disposed over the active layer 1130 may be described, the thin film transistor TFT may be a bottom gate-type thin film transistor in which the gate electrode G may be disposed below the active layer 1130.

The active layer 1130 on the buffer layer 111 may include, for example, polycrystalline silicon. The active layer 1130 may include a channel region, a source region, and a drain region, the channel region overlapping the gate electrode G. The source region and the drain region may be disposed on two opposite sides of the channel region and doped with impurities having a higher concentration than that of the channel region. Here, the impurities may include N-type impurities or P-type impurities. In another embodiment, the active layer 1130 may include amorphous silicon or an organic semiconductor material. In another embodiment, the active layer 1130 may include an oxide semiconductor.

The gate electrode G may be disposed over the active layer 1130 with a first gate insulating layer 112 therebetween. The gate electrode G may include at least one of molybdenum (Mo), aluminum (Al), copper (Cu), and titanium (Ti), and may include a single layer or a multi-layer.

The first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$).

A second gate insulating layer 113 may cover the gate electrode G. The second gate insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$).

The source electrode S and the drain electrode D may be disposed on an interlayer insulating layer 115. The source electrode S and the drain electrode D may include a conductive material including molybdenum (Mo), aluminum (Al), copper (Cu), titanium (Ti), or a combination thereof, and may include a single layer or a multi-layer including the above materials.

A planarization layer 117 may be disposed on the source electrode S and the drain electrode D. An organic light-emitting diode OLED may be disposed on the planarization layer 117. The organic light-emitting diode OLED may be electrically connected to the thin film transistor TFT. For example, the organic light-emitting diode OLED may be electrically connected to the drain electrode D.

The planarization layer 117 may have a flat top surface such that a pixel electrode 210 may be formed flat. The planarization layer 117 may include a single layer or a multi-layer including an organic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). In the case where the planarization layer 117 includes an inorganic material, chemical mechanical polishing may be performed depending on the case. The planarization layer 117 may include both an organic material and an inorganic material.

The pixel electrode 210 may include a (semi)-transparent electrode or a reflective electrode. In an embodiment, the pixel electrode 210 may include a reflective layer and a transparent or (semi)-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or (semi)-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). In an embodiment, the pixel electrode 210 may have a stacked structure of ITO/Ag/ITO.

A pixel-defining layer 119 may be disposed on the planarization layer 117. The pixel-defining layer 119 may define an emission region by including an opening corresponding to a pixel, that is, an opening exposing at least a central portion of the pixel electrode 210. The pixel-defining layer 119 may prevent an arc, etc. from occurring between edges of the pixel electrode 210 and the common electrode 230 by increasing a distance between the edges of the pixel electrode 210 and the common electrode 230. The pixel-defining layer 119 may include, for example, an organic material such as polyimide or HMDSO.

An intermediate layer 220 may include a low molecular weight material or a polymer material. In the case where the intermediate layer 220 includes a low molecular weight material, the intermediate layer 220 may have a structure in which an HIL, an HTL, an emission layer (EML), an ETL, an EIL, etc. may be stacked in a single or a composite configuration. The intermediate layer 220 may include various organic materials such as copper phthalocyanine (CuPc), N,N'-Di (naphthalene-1-yl)-N, N'-diphenyl-benzidine (NPB), tris-8-hydroxyquinoline aluminum (Alq3), or a combination thereof. These layers may be formed by vacuum deposition.

In the case where the intermediate layer 220 includes a polymer material, the intermediate layer 220 may have a structure including an HTL and an EML. The HTL may include poly-3, 4-ethylene dioxy thiophene (PEDOT), and the EML may include a polymer material such as a poly-phenylene vinylene (PPV)-based material or a polyfluorene-based material. The structure of the intermediate layer 220 is not limited to the above description and may have various structures. For example, at least one of layers constituting the intermediate layer 220 may be formed as one body over the pixel electrodes 210. As another example, the intermediate layer 220 may include a layer patterned to correspond to each of the pixel electrodes 210.

The common electrode 230 may include a transparent electrode or a reflective electrode. In an embodiment, the common electrode 230 may include a transparent or semi-transparent electrode and may include a metal thin layer having a small work function and including at least one of lithium (Li), calcium (Ca), lithium fluoride (LiF)/Ca, LiF/aluminum (Al), Al, silver (Ag), magnesium (Mg), and a compound thereof. The common electrode 230 may be disposed over the first display area DA1 and the second display area DA2 and disposed on the intermediate layer 220 and the pixel-defining layer 119.

The transmission area TA of the second display area DA2 may be an area through which a light signal and/or a sound signal emitted from the input/output component 300 passes. For precise signal transfer, the common electrode 230 may not be formed in the transmission area TA. According to an experiment, a case where the common electrode 230 may not be formed in the transmission area TA shows about 1.5 times higher transmittance than a case where the common electrode 230 may be formed in the transmission area TA. A process of manufacturing the common electrode 230 having this characteristic structure is described below. Also, to improve a transmittance of the transmission area TA, the planarization layer 117 and the pixel-defining layer 119 may be removed from the transmission area TA.

A blocking layer BSM may be disposed between the substrate 100 and the thin film transistor TFT in a position overlapping the second pixel Pa in the second display area DA2. The blocking layer BSM blocks the thin film transistor TFT such that the thin film transistor TFT may not be influenced by a light signal or a sound signal from the input/output component 300 adjacent thereto. For example, the blocking layer BSM may be disposed between the first buffer layer 111a and the second buffer layer 111b.

Though not shown, a thin-film encapsulation layer may be formed on the common electrode 230, the thin-film encapsulation layer including at least one inorganic encapsulation layer and at least one organic encapsulation layer that may be stacked. The inorganic encapsulation layer may include at least one inorganic insulating material among aluminum oxide, titanium oxide, tantalum oxide, hafnium oxide, zinc oxide, silicon oxide, silicon nitride, and silicon oxynitride. The organic encapsulation layer may include polyethylene terephthalate, polyethylene naphthalate, polycarbonate, polyimide, polyethylene sulfonate, polyoxymethylene, polyacrylate, HMDSO, an acryl-based resin (e.g. polymethylmethacrylate, polyacrylic acid, etc.), or a combination thereof.

Figure 3:
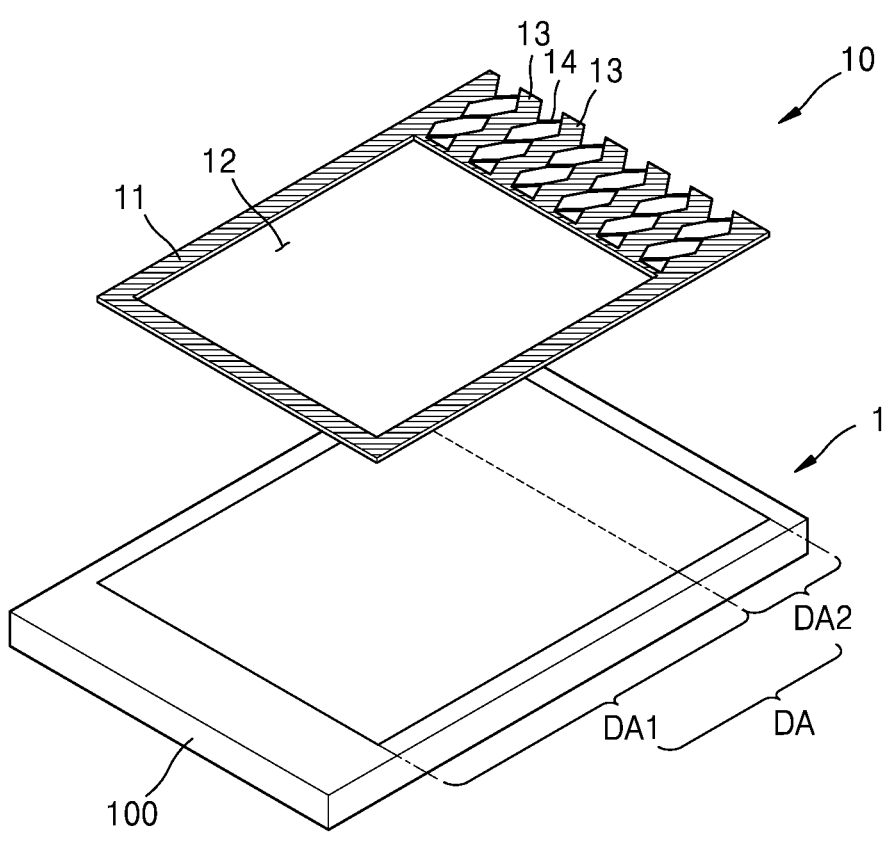
FIG. 3 is a schematic perspective view for illustrating some processes of manufacturing the display device of FIG. 1.
Figure 4:
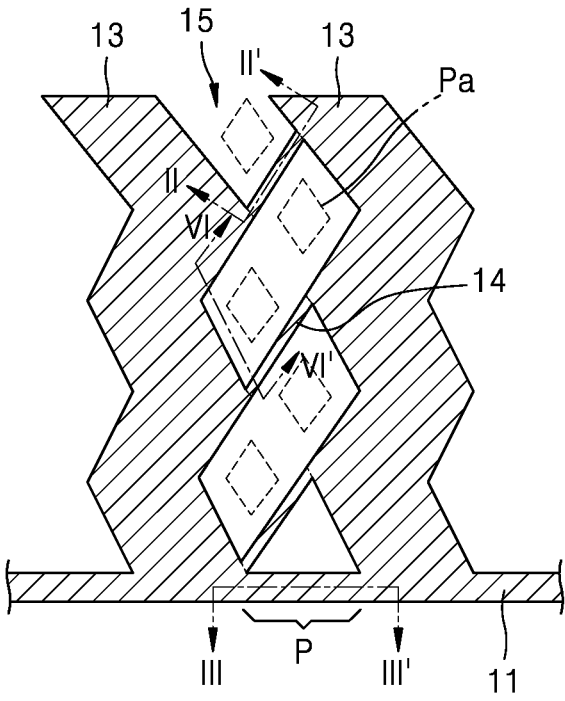
FIG. 4 is a schematic plan view of a portion of a deposition mask of FIG. 3.
Figure 5:
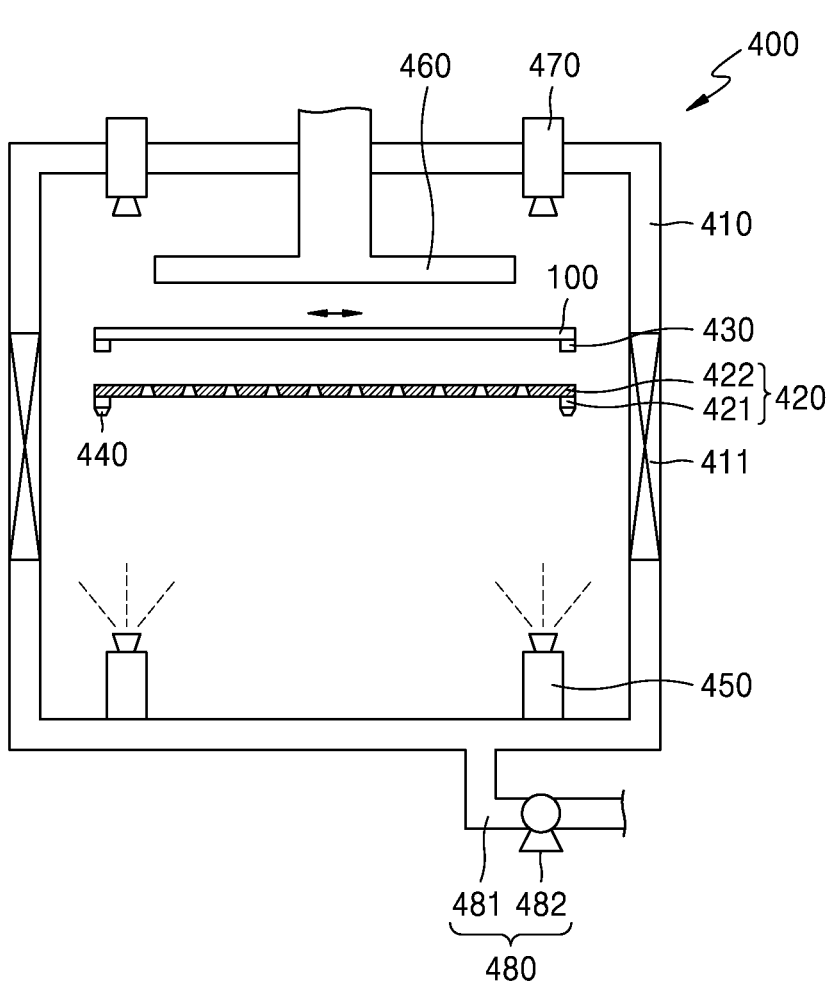
FIG. 5 is a schematic cross-sectional view of an example of a manufacturing apparatus used during a process of manufacturing the display device of FIG. 2.
Figure 6:
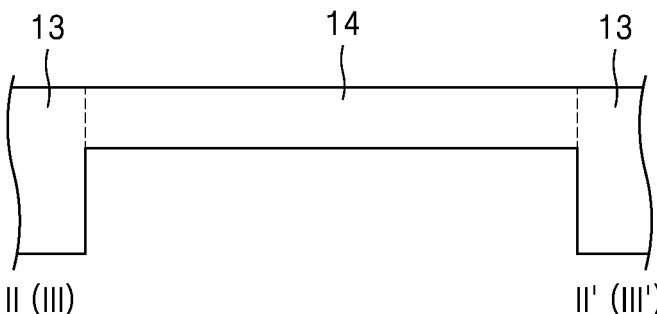
FIG. 6 is a schematic cross-sectional view of an example of the deposition mask taken along line II-II' of FIG. 4.

FIG. 3 is a schematic perspective view of some processes of manufacturing the display device of FIG. 1. FIG. 4 is a schematic plan view of a portion of a deposition mask of FIG. 3. FIG. 5 is a schematic cross-sectional view of an example of a manufacturing apparatus used during a process of manufacturing the display device of FIG. 2. FIG. 6 is a schematic cross-sectional view of an example of the deposition mask taken along line II-II' of FIG. 4.

FIG. 3 shows a method of forming the common electrode 230 (see FIG. 7) over the substrate 100. Specifically, a deposition mask 10 may be closely attached to the substrate 100, and a material that forms the common electrode 230 (see FIG. 7) may be deposited over the substrate 100 through the deposition mask 10. The common electrode 230 (see FIG. 7) may be formed over the first display area DA1 and the second display area DA2 by one-time deposition process. For this purpose, the deposition mask 10 may include a first opening 12 and ribs 13, the first opening 12 corresponding to the first display area DA1.

The first opening 12 may be defined by a main frame 11 of the deposition mask 10. The ribs 13 may protrude from a side of the main frame toward the outside in a plan view to correspond to the second display area DA2. For example, the ribs 13 may protrude from the side of the main frame 11 away from the main frame 11.

The ribs 13 may be apart from each other, and as shown in FIG. 4, second openings 15 may be defined between the ribs 13. Since the ribs 13 may be disposed to correspond to the transmission area TA (see FIG. 6), consequently, the common electrode 230 (see FIG. 7) may not be deposited in the transmission area TA (see FIG. 6).

In contrast, the second openings 15 may be formed in positions to overlap the second pixels Pa. Though this configuration, the common electrode 230 (see FIG. 7) may be deposited on positions corresponding to the second pixels Pa. A width of the second opening 15 may be greater than a width of the second pixels Pa. As a result, the common electrode 230 (see FIG. 7) deposited through the second openings 15 may cover the second pixels Pa. Here, the width of the second pixels Pa may mean a width of a width of the pixel-defining layer 119 (see FIG. 2) defining the emission region. Therefore, even though a minute alignment error between the deposition mask 10 and the substrate 100 may occur during a process of forming the common electrode 230 (see FIG. 7), the occurrence of a formation defect of the common electrode 230 (see FIG. 7) may be prevented.

The ribs 13 may be connected to each other by bridges 14. For example, the bridge 14 may cross the second opening 15 and be disposed between forming regions of the second pixels Pa. Here, in case that the bridge 14 may be referred to as crossing the second opening 15, it may not only cross the second opening 15 at a shortest distance but also may obliquely cross the second opening 15 with a straight shape depending on a position of the second pixels Pa as shown in FIG. 4. The bridge 14 may allow the common electrode 230 (see FIG. 7) to be formed at an accurate position in the second display area DA2 by fixing the positions of the ribs 13 extended from the main frame 11.

The forming of the common electrode 230 (see FIG. 7) by using the deposition mask 10 may be performed by using a manufacturing apparatus 400 shown in FIG. 5. The manufacturing apparatus 400 may include a chamber 410, a mask assembly 420, a first supporter 430, a second supporter 440, a deposition source 450, a magnetic force generator 460, a vision part 470, and a pressure adjuster 480.

The chamber 410 may include a space therein, and a portion of the chamber 410 may be open. A gate valve 411 may be disposed in an open portion of the chamber 410 such that the gate valve 411 may be opened/closed. The pressure adjuster 480 may be connected to the chamber 410 to adjust the pressure of the inside of the chamber 410. The pressure adjuster 480 may include a connection pipe 481 and a pump 482, the connection pipe 481 being connected to the chamber 410, and the pump 482 being disposed at the connection pipe 481.

The mask assembly 420 may include a mask sheet 422 and a mask frame 421 coupled to the mask sheet 422. The mask sheet 422 may include the deposition mask 10 described above. For example, the mask sheet 422 may include multiple deposition masks 10. The mask sheet 422 may be fixed to the mask frame 421 with tensile force applied thereto.

The substrate 100 may be safely seated on the first supporter 430. The first supporter 430 may adjust the position of the substrate 100. For example, the first supporter 430 may include a UVW stage. The mask assembly 420 may be safely seated on the second supporter 440. Similarly to the first supporter 430, the second supporter 440 may adjust the position of the mask assembly 420.

The deposition source 450 may receive a deposition material and evaporate or sublimate the deposition material to supply the deposition material to the chamber 410. The deposition source 450 may include a heater therein and melt or sublimate the deposition material by heating the deposition material inside the deposition source 450 through an operation of the heater.

The vision part 470 may be disposed on the chamber 410 and may photograph the positions of the mask assembly 420 and the substrate 100. The vision part 470 may photograph an alignment mark of at least one of the mask assembly 420 and the substrate 100.

The magnetic force generator 460 may be disposed in the chamber 410 and may closely attach the substrate 100 to the mask assembly 420. The magnetic force generator 460 may include an electromagnet or a permanent magnet generating magnetic force. As described above, since the deposition mask 10 may include the bridge 14 that may fix the positions of the ribs 13 extended from the main frame 11, the deposition mask 10 may prevent the positions of the ribs 13 from being twisted while the substrate 100 may be closely attached to the mask assembly 420. As a result, the common electrode 230 (see FIG. 7) may be deposited at an accurate position in the second display area DA2.

The common electrode 230 (see FIG. 7) in the second display area DA2 may be deposited through the second openings 15 between the ribs 13. The bridge 14 may be disposed to cross the second openings 15. However, it may be required that the common electrode 230 (see FIG. 7) deposited through the second openings 15 may not be disconnected by the bridge 14. For this purpose, as shown in FIG. 6, the bridge 14 and the rib 13 may form the same top surface, and a thickness of the bridge 14 may be less than a thickness of the rib 13. For example, since a bottom surface of the bridge 14 may be apart from a deposition surface on which the common electrode 230 may be deposited, the common electrode 230 may be deposited also below the bridge 14, and the common electrode 230 (see FIG. 7) may be continuously formed in the second display area DA2 without being disconnected by the bridge 14.

Since the ribs 13 have a protruding shape from the main frame 11 of the deposition mask 10, the common electrode 230 (see FIG. 7) should be prevented from being disconnected by the main frame 11 in the first display area DA1 and the second display area DA2. For this purpose, a region P of the main frame 11 that neighbors the second opening 15 may have the same shape as that of the bridge 14. For example, a portion of the main frame 11 corresponding to the region P may have a thickness less than that of the surroundings, and a cross-section of the deposition mask 10 taken along line II-II' of FIG. 4 and a cross-section of the deposition mask 10 taken along line III-III' of FIG. 4 may have the same shape as shown in FIG. 6. As a result, in case of depositing the common electrode 230 (see FIG. 7) by using the deposition mask 10, the common electrode 230 (see FIG. 7) may be prevented from being separated in the first display area DA1 and the second display area DA2.

Figure 7:
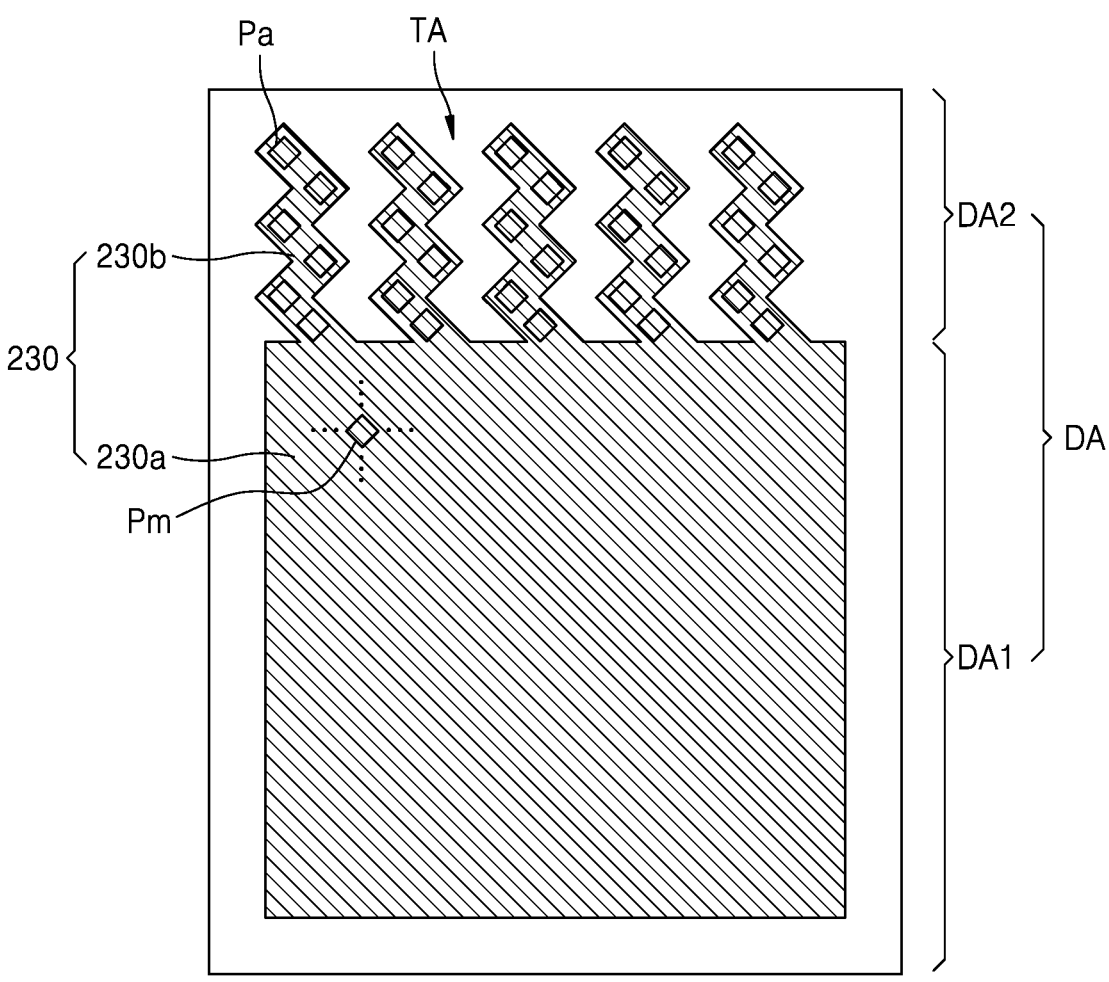
FIG. 7 is a schematic plan view of the display device of FIG. 1.
Figure 8:
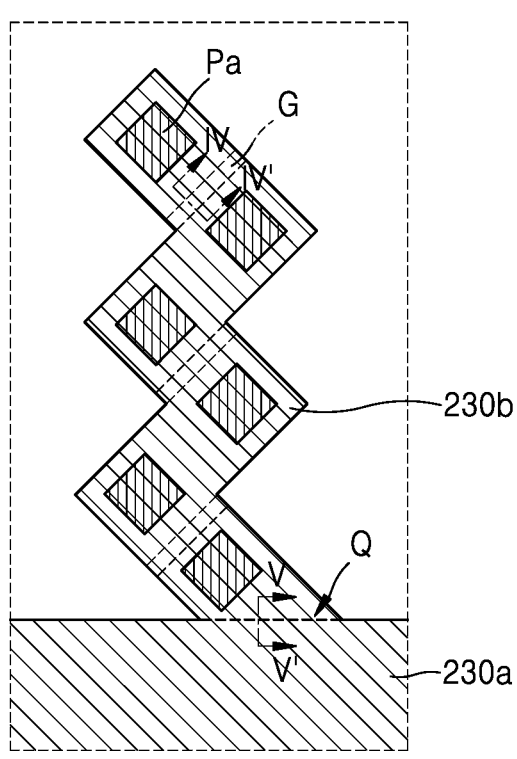
FIG. 8 is a schematic plan view of a portion of a common electrode of the display device of FIG. 7.
Figure 9:
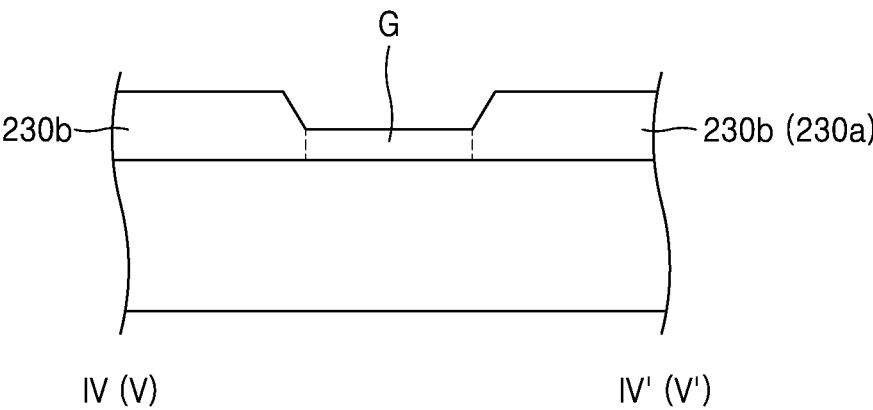
FIG. 9 is a schematic cross-sectional view of an example of the display device taken along line IV-IV' of FIG. 8.

FIG. 7 is a schematic plan view of the display device of FIG. 1. FIG. 8 is a schematic plan view of a portion of the common electrode of the display device of FIG. 7. FIG. 9 is a schematic cross-sectional view of an example of the display device taken along line IV-IV' of FIG. 8.

First, as shown in FIG. 7, the display area DA may include the first display area DA1 and the second display area DA2 respectively having different resolutions. The common electrode 230 may include a main common electrode 230a and extension portions 230b, the main common electrode 230a being disposed in the first display area DA1, and the extension portions 230b being disposed in the second display area DA2.

The common electrode 230 may be formed through one-time deposition process by using the deposition mask 10 (see FIG. 3) described above. Through this, the main common electrode 230a and the extension portions 230b may be formed as one body. Therefore, the first pixels Pm and the second pixels Pa may include the common electrode 230 provided as one body.

The first pixels Pm may be densely disposed in the first display area DA1, and the main common electrode 230a may be formed as one body to correspond to the first pixels Pm.

Since the second pixels Pa may be less densely disposed in the second display area DA2 than the first pixels Pm, the resolution of the second display area DA2 may be less than the resolution of the first display area DA1. The extension portions 230b may protrude from the main common electrode 230a and respectively correspond to the second pixels Pa.

Although it is shown in FIG. 7 that the extension portions 230b may have a zigzag shape, the shape of the extension portions 230b may be variously changed depending on the arrangement of the second pixels Pa. For example, the extension portions 230b may be formed long in a straight line shape or obliquely formed, depending on the arrangement of the second pixels Pa. The extension portions 230b may be apart from each other in a direction perpendicular to the extension direction to form the transmission area TA.

The extension portions 230b may respectively cover the second pixels Pa, and a width of an extension portion 230b may be greater than a width of a second pixel Pa. Here, the width of the second pixels Pa may mean a width of the opening of the pixel-defining layer 119 (see FIG. 2) defining the emission region. The extension portion 230b may include a first region G between the second pixels Pa, the first region G being thinner than a thickness of the main common electrode 230a. The first region G may have a concave shape having a top surface that may be less than a top surface of the surroundings. The first region G may be formed at a position at which the bridge 14 (see FIG. 4) described above may be disposed and may have the same pattern as that of the bridge 14 (see FIG. 4). For example, the first region G may cross the extension portion 230b.

As described above, since the region P of the main frame that neighbors the second opening 15 (see FIG. 4) may have the same shape as that of the bridge 14 (see FIG. 4), the common electrode 230 may further include a second region Q having a height less than that of the common electrode 230 adjacent thereto, the second region Q being at a connection portion of the main common electrode 230a and the extension portion 230b. For example, cross-sections of the display device taken along line IV-IV and line V-V of FIG. 8 may have the same shape as shown in FIG. 9.

Figure 10:
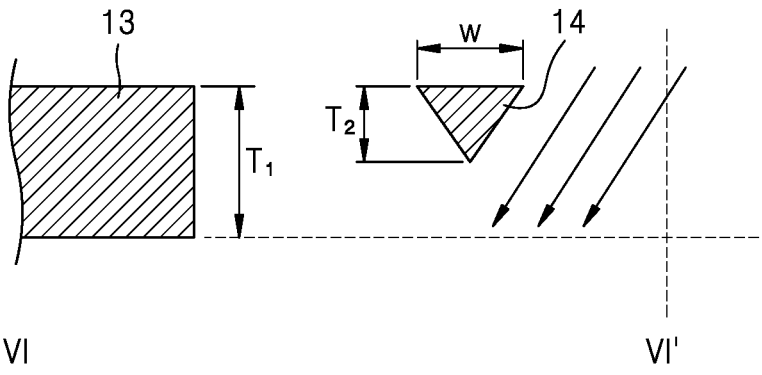
FIG. 10 is a schematic cross-sectional view of an example of the deposition mask taken along line VI-VI' of FIG. 4.

FIG. 10 is a schematic cross-sectional view of an example of the deposition mask taken along line VI-VI' of FIG. 4.

FIG. 10 shows a cross-sectional shape perpendicular to a lengthwise direction of the bridge 14. As described above, since the bottom surface of the bridge 14 may be apart from the deposition surface, the common electrode 230 (see FIG. 7) may be deposited below the bridge 14. In case of depositing the common electrode 230 (see FIG. 7), the deposition material may be obliquely incident. To improve a deposition efficiency of a portion below the bridge 14, a shape of a vertical cross-section of the bridge 14 may be an inverted triangle. However, the disclosure is not limited thereto and the bridge 14 may have various shapes.

To improve the efficiency of depositing the common electrode 230 (see FIG. 2) below the bridge 14, a thickness T2 of the bridge 14 may be greater than a width W of the bridge 14, and a difference between a thickness T1 of the rib 13 and the thickness T2 of the bridge 14 may be at least about 0.5 times the width W of the bridge 14.

According to embodiments, since an image may be displayed even in an area in which an input/output component may be disposed, a display device in which a display area may be extended may be implemented. The common electrode may be formed in an entire region including a main display area and an area in which an input/output component may be disposed by one-time deposition process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including their equivalents.

What is claimed is:

1. A deposition mask comprising:
a main frame defining a first opening;
ribs extending away from a side of the main frame, the ribs being apart from each other and defining second openings; and
bridges connecting the ribs to one another across the second openings, wherein
the bridges and the ribs form a same upper surface,
each bridge includes an inclined lateral surface sloped with regard to a thickness direction of each bridge,
a thickness of each of the bridges is less than a thickness of each of the ribs,
the side of the main frame, which defines the first opening and from which the ribs extend, is formed by alternatively arranging the ribs and the bridges and is disposed between the first opening and the second openings,
upper surfaces of the ribs of the side of the main frame are coplanar with upper surfaces of the bridges of the side of the main frame, and
lower surfaces of the ribs of the side of the main frame are recessed from lower surfaces of the bridges of the side of the main frame.

2. The deposition mask of claim 1, wherein a cross-section of each bridge has an inverted triangle shape, the cross-section of each bridge being perpendicular to a lengthwise direction of each bridge.

3. The deposition mask of claim 1, wherein a width of each bridge in a direction perpendicular to a lengthwise direction of each bridge is less than a thickness of each bridge, and a difference between the thickness of each rib and the thickness of each bridge is at least about 0.5 times the width of each bridge.

4. The deposition mask of claim 1, wherein a region of the main frame that neighbors the second openings has a same shape of the bridges in a cross-sectional view.

5. The deposition mask of claim 1, wherein the inclined lateral surface of each bridge includes a first inclined lateral surface and a second inclined lateral surface that are gradually closer to each other or gradually farther from each other.

6. The deposition mask of claim 1, wherein a width of each bridge gradually decreases as being farther from an upper surface of each bridge.

7. The deposition mask of claim 1, wherein a thickness of a region of the main frame that neighbors the second openings is substantially same as a thickness of the bridges.

8. The deposition mask of claim 1, wherein a region of the main frame that neighbors the second openings extends in a first direction, and each of the bridges extends in a second direction intersecting the first direction.

9. The deposition mask of claim 1, wherein the second openings include a triangle-shaped opening and a four-sided opening.

10. The deposition mask of claim 9, wherein the triangle-shaped opening is disposed between the four-sided opening of the second openings and the first opening.

11. The deposition mask of claim 1, wherein the bridges include a first bridge and a second bridge, the first bride is adjacent to the first opening and extends in a first direction, and the second bridge is spaced apart from the first opening and extends a diagonal direction relative to the first direction.

12. The deposition mask of claim 11, wherein a width of the first bridge is greater than a width of the second bridge.

\* \* \* \* \*